(12) United States Patent
Lee et al.

(10) Patent No.: US 12,304,122 B2
(45) Date of Patent: May 20, 2025

(54) SEMICONDUCTOR MANUFACTURING DEVICE AND METHOD OF ENHANCING MOLD GATE INJECTOR AND AIR VENT TO REDUCE VOIDS IN ENCAPSULANT

(71) Applicant: STATS ChipPAC Pte. Ltd., Singapore (SG)

(72) Inventors: HunTeak Lee, Gyeongi-do (KR); KyungHwan Kim, Incheon (KR)

(73) Assignee: STATS ChipPAC Pte. Ltd., Singapore (SG)

( * ) Notice: Subject to any disclaimer, the term of this patent is extended or adjusted under 35 U.S.C. 154(b) by 468 days.

(21) Appl. No.: 17/304,339

(22) Filed: Jun. 18, 2021

(65) Prior Publication Data

US 2022/0250296 A1 Aug. 11, 2022

Related U.S. Application Data

(60) Provisional application No. 63/147,810, filed on Feb. 10, 2021.

(51) Int. Cl.
| | |
|---|---|
| *B29C 45/14* | (2006.01) |
| *B29C 45/34* | (2006.01) |
| *H01L 21/56* | (2006.01) |
| *B29K 63/00* | (2006.01) |
| *B29K 105/16* | (2006.01) |
| *B29L 31/34* | (2006.01) |

(52) U.S. Cl.
CPC ........ *B29C 45/14819* (2013.01); *B29C 45/34* (2013.01); *H01L 21/561* (2013.01); *B29K 2063/00* (2013.01); *B29K 2105/16* (2013.01); *B29L 2031/34* (2013.01)

(58) Field of Classification Search
CPC ..................................................... H01L 21/561
See application file for complete search history.

(56) References Cited

U.S. PATENT DOCUMENTS

2005/0087852 A1* 4/2005 Chen .................... H01L 23/3128
                                                                438/109
2021/0151359 A1* 5/2021 Bathan .................... H01L 24/97

\* cited by examiner

*Primary Examiner* — Yu-Hsi D Sun
(74) *Attorney, Agent, or Firm* — Robert D. Atkins; PATENT LAW GROUP: Atkins and Associates, P.C.

(57) ABSTRACT

A semiconductor manufacturing device has a strip panel and a plurality of electrical components disposed over the strip panel. An encapsulant is disposed over the electrical components using a mold gate injector and directed in a path toward higher flow resistance for the encapsulant over the electrical components. The mold gate injector can be shifted toward a side of the strip panel with the path toward higher flow resistance for the encapsulant. The mold gate injector can have a discharge port smaller than the mold gate injector directed at the path toward higher flow resistance for the encapsulant. The discharge port injector can be shifted toward a side of the strip panel with the path toward higher flow resistance for the encapsulant. An air vent and air tank can be coupled to the mold gate injector to aid in release of excess air from the encapsulant.

26 Claims, 9 Drawing Sheets

SEMICONDUCTOR MANUFACTURING DEVICE AND METHOD OF ENHANCING MOLD GATE INJECTOR AND AIR VENT TO REDUCE VOIDS IN ENCAPSULANT

CLAIM OF DOMESTIC PRIORITY

The present application claims the benefit of U.S. Provisional Application No. 63/147,810, filed Feb. 10, 2021, which application is incorporated herein by reference.

FIELD OF THE INVENTION

The present invention relates in general to semiconductor manufacturing devices and, more particularly, to a semiconductor manufacturing device and method of enhancing a mold gate injector and air vent to reduce voids in encapsulant.

BACKGROUND OF THE INVENTION

Semiconductor devices are commonly found in modern electronic products. Semiconductor devices perform a wide range of functions, such as signal processing, high-speed calculations, transmitting and receiving electromagnetic signals, controlling electronic devices, photo-electric, and creating visual images for television displays. Semiconductor devices are found in the fields of communications, power conversion, networks, computers, entertainment, and consumer products. Semiconductor devices are also found in military applications, aviation, automotive, industrial controllers, and office equipment.

Multiple semiconductor die and IPDs can be integrated into a system in package (SIP) module for higher density in a small space and extended electrical functionality. Within the SIP module, semiconductor die and IPDs are mounted to a substrate for structural support and electrical interconnect. The SIP module often contains many electrical components and can be laid out in an irregular pattern. The electrical components are typically encapsulated for structural support and environmental protection from external elements and contaminants.

During encapsulation, the SIP modules are placed on a substrate strip panel and aligned adjacent to mold gate injectors. The mold gate injectors are placed so as to extend a width of the substrate strip panel, or a portion of the substrate strip panel containing the electrical components. That is, the mold gate injectors are aligned with electrical component area of the strip panel to be encapsulated. The encapsulant, for example epoxy molding compound (EMC), flows over the electrical components on the substrate strip panel. If SIP module contains various size electrical components, the EMC tends toward the lesser flow resistance path over the smaller components. If the larger profile and footprint electrical components are generally located on a first side of the substrate strip panel and the smaller profile and footprint electrical components are generally located on a second side of the strip panel, then the EMC flow tends toward to the second side, i.e., the lesser flow resistance path. The larger electrical components, being a higher flow resistance path, are essentially starved of EMC. Voids in the encapsulation can occur, particularly over the larger electrical components and potentially all components on the first side of the substrate strip panel. In many cases, the end of the substrate strip panel opposite the mold gate injectors does not completely fill with EMC leaving voids in the encapsulation over the electrical components located at the far end of the strip panel. The voids in encapsulation create defects and reduce reliability.

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings. The term "semiconductor die" as used herein refers to both the singular and plural form of the words, and accordingly, can refer to both a single semiconductor device and multiple semiconductor devices.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Back-end manufacturing refers to cutting or singulating the finished wafer into the individual semiconductor die and packaging the semiconductor die for structural support, electrical interconnect, and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with conductive layers, bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 1A:
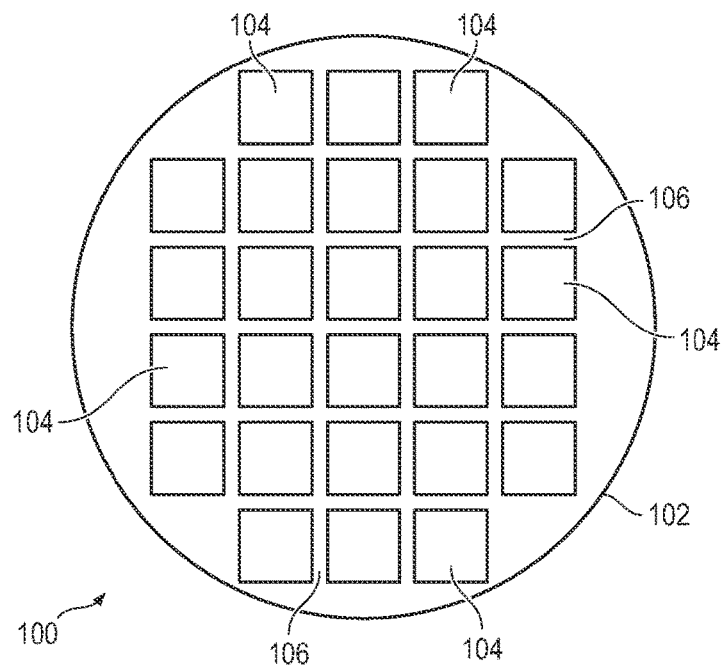
FIGS. 1a-1c illustrate a semiconductor wafer with a plurality of semiconductor die separated by a saw street.

FIG. 1a shows a semiconductor wafer 100 with a base substrate material 102, such as silicon, germanium, aluminum phosphide, aluminum arsenide, gallium arsenide, gallium nitride, indium phosphide, silicon carbide, or other bulk material for structural support. A plurality of semiconductor die or components 104 is formed on wafer 100 separated by a non-active, inter-die wafer area or saw street 106. Saw street 106 provides cutting areas to singulate semiconductor wafer 100 into individual semiconductor die 104. In one embodiment, semiconductor wafer 100 has a width or diameter of 100-450 millimeters (mm).

Figure 1B:
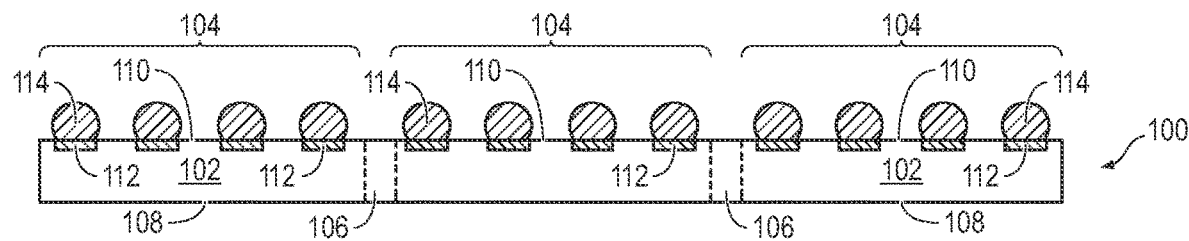

FIG. 1b shows a cross-sectional view of a portion of semiconductor wafer 100. Each semiconductor die 104 has a back or non-active surface 108 and an active surface 110 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 110 to implement analog circuits or digital circuits, such as digital signal processor (DSP), application specific integrated circuits (ASIC), memory, or other signal processing circuit. Semiconductor die 104 may also contain IPDs, such as inductors, capacitors, and resistors, for RF signal processing.

An electrically conductive layer 112 is formed over active surface 110 using PVD, CVD, electrolytic plating, electroless plating process, or other suitable metal deposition process. Conductive layer 112 can be one or more layers of aluminum (Al), copper (Cu), tin (Sn), nickel (Ni), gold (Au), silver (Ag), or other suitable electrically conductive material. Conductive layer 112 operates as contact pads electrically connected to the circuits on active surface 110.

An electrically conductive bump material is deposited over conductive layer 112 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 112 using a suitable attachment or bonding process. In one embodiment, the bump material is reflowed by heating the material above its melting point to form balls or bumps 114. In one embodiment, bump 114 is formed over an under bump metallization (UBM) having a wetting layer, barrier layer, and adhesive layer. Bump 114 can also be compression bonded or thermocompression bonded to conductive layer 112. Bump 114 represents one type of interconnect structure that can be formed over conductive layer 112. The interconnect structure can also use bond wires, conductive paste, stud bump, micro bump, or other electrical interconnect.

Figure 1C:
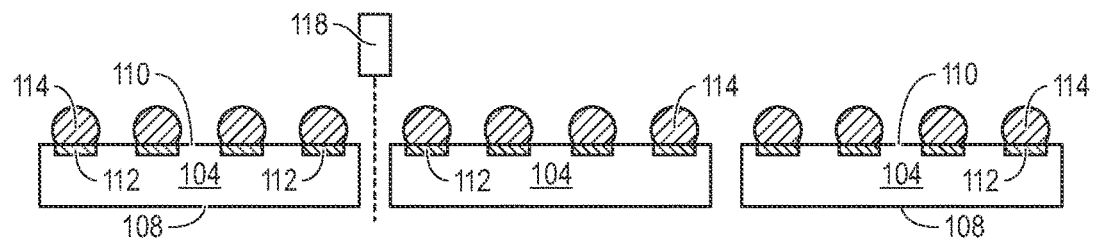

In FIG. 1c, semiconductor wafer 100 is singulated through saw street 106 using a saw blade or laser cutting tool 118 into individual semiconductor die 104. The individual semiconductor die 104 can be inspected and electrically tested for identification of KGD post singulation.

Figure 2A:
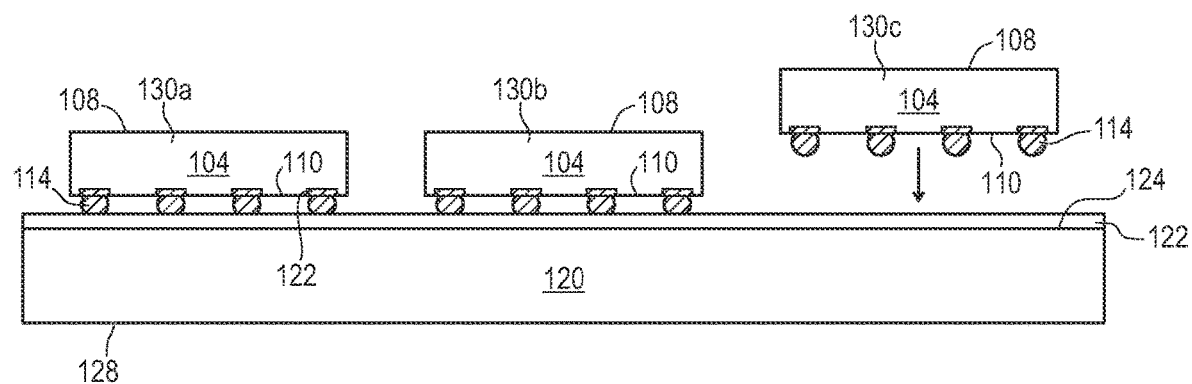
FIGS. 2a-2f illustrate a process of shifting a mold gate injector toward a higher flow resistance path to reduce voids in the encapsulant.

FIGS. 2a-2f illustrate a process of shifting a mold gate injector toward a higher flow resistance path to reduce voids in the encapsulant. FIG. 2a shows a cross-sectional view of temporary substrate strip panel 120 containing sacrificial base material such as silicon, polymer, beryllium oxide, glass, or other suitable low-cost, rigid material for structural support. An interface layer or double-sided tape 122 is formed over surface 124 of substrate strip panel 120 as a temporary adhesive bonding film, etch-stop layer, or thermal release layer.

Substrate strip panel 120 is a standardized carrier with capacity for multiple semiconductor die or other electrical components and can accommodate semiconductor die of multiple sizes singulated from semiconductor wafers having any diameter. For example, substrate strip panel 120 can be a round panel with a diameter of 300 mm or greater, or substrate strip panel 120 can be a rectangular panel with a length of 300 mm or greater and a width of 600 mm or greater. Substrate strip panel 120 may have a larger surface area than the surface area of semiconductor wafer 100. In one embodiment, semiconductor wafer 100 has a diameter of 300 mm and contains semiconductor die 104 which have a length of 10 mm and a width of 10 mm. Substrate strip panel 120 can accommodate both 10 mm by 10 mm semiconductor die 104 and any other size of semiconductor die or electrical component.

Figure 2B:
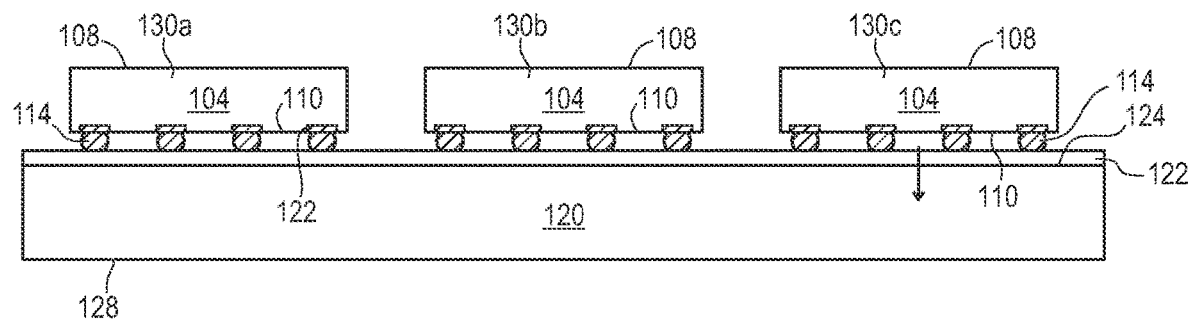

A plurality of electrical components 130a-130c is mounted to interface layer 122 over surface 124 of substrate strip panel 120. Electrical components 130a-130c are each positioned over substrate strip panel 120 using a pick and place operation. For example, electrical components 130a-130c can be semiconductor die 104 from FIG. 1c with active surface 110 and bumps 114 oriented toward surface 124 of substrate strip panel 120. Alternatively, electrical components 130a-130c can include another semiconductor die, semiconductor package, surface mount device, discrete electrical device, discrete transistor, diode, or IPD. Electrical components 130a-130c can encompass a variety of sizes, profiles, and footprints. Some electrical components 130a-130c have a large size, profile, and footprint. Other electrical components 130a-130c have a small size, profile, and footprint. FIG. 2b shows electrical components 130a-130c mounted to substrate strip panel 120.

Figure 2C:
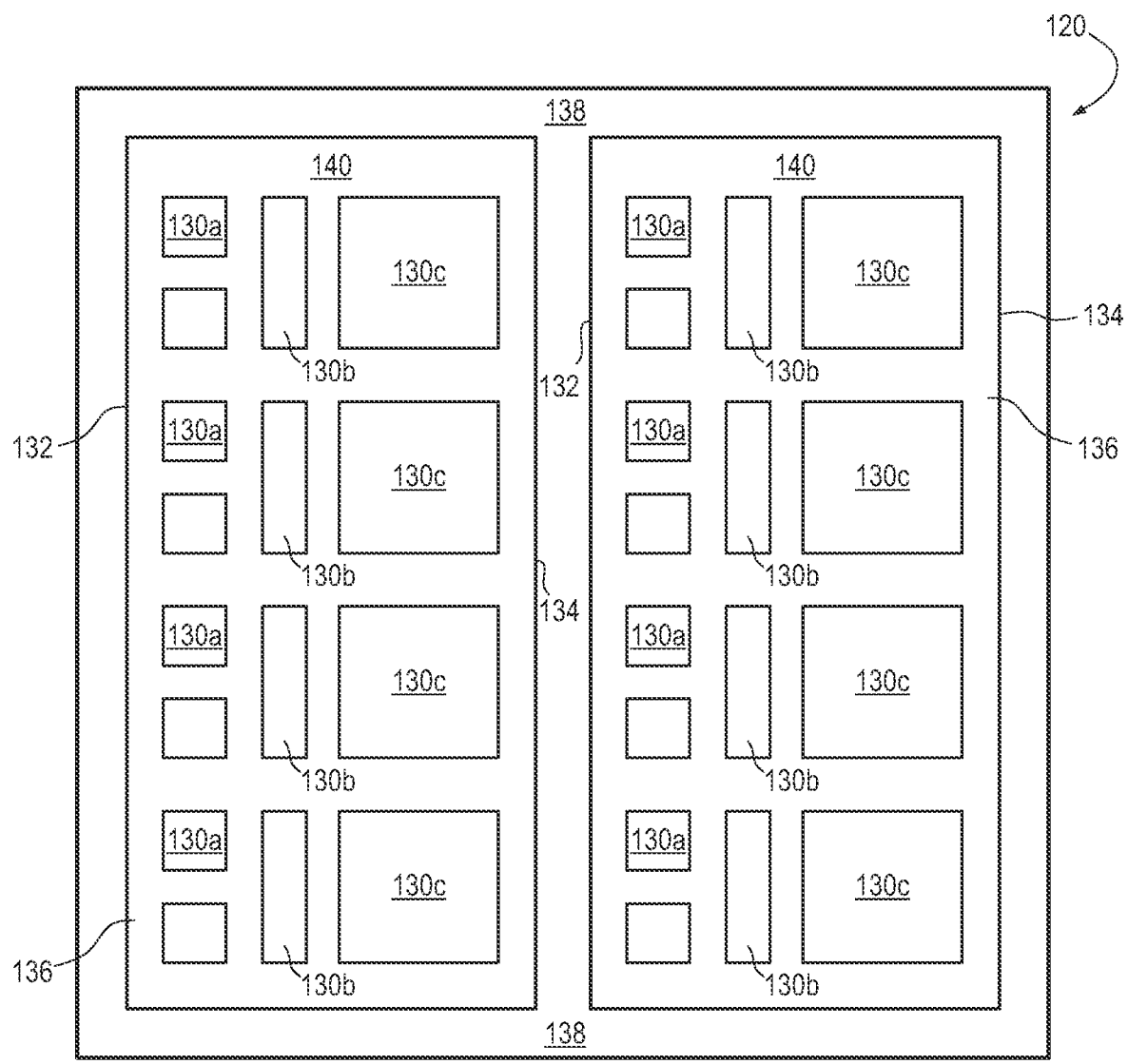

FIG. 2c shows a top view of electrical components 130a-130c mounted to substrate strip panel 120. In one embodiment, substrate strip panel 120 includes a plurality of unit strip panels 136. Unit substrate panels 136 contain electrical components 130a-130c. In the present example, smaller size electrical components 130a are located toward the side 132 of unit strip panel 136, mid-size electrical components 130b are located in a central portion of unit strip panel 136, and larger electrical components 130c are located toward the right side 134 of unit strip panel 136. Area 138 is designated as an unoccupied area of substrate strip panel 120, i.e., no electrical components and no encapsulant. Area 138 is within substrate strip panel 120 and outside unit strip panel 136. Area 140 is designated as an encapsulation area of unit strip panel 136 containing electrical components 130a-130c. Area 140 is within unit strip panel 136 and within substrate strip panel 120.

Figure 2D:
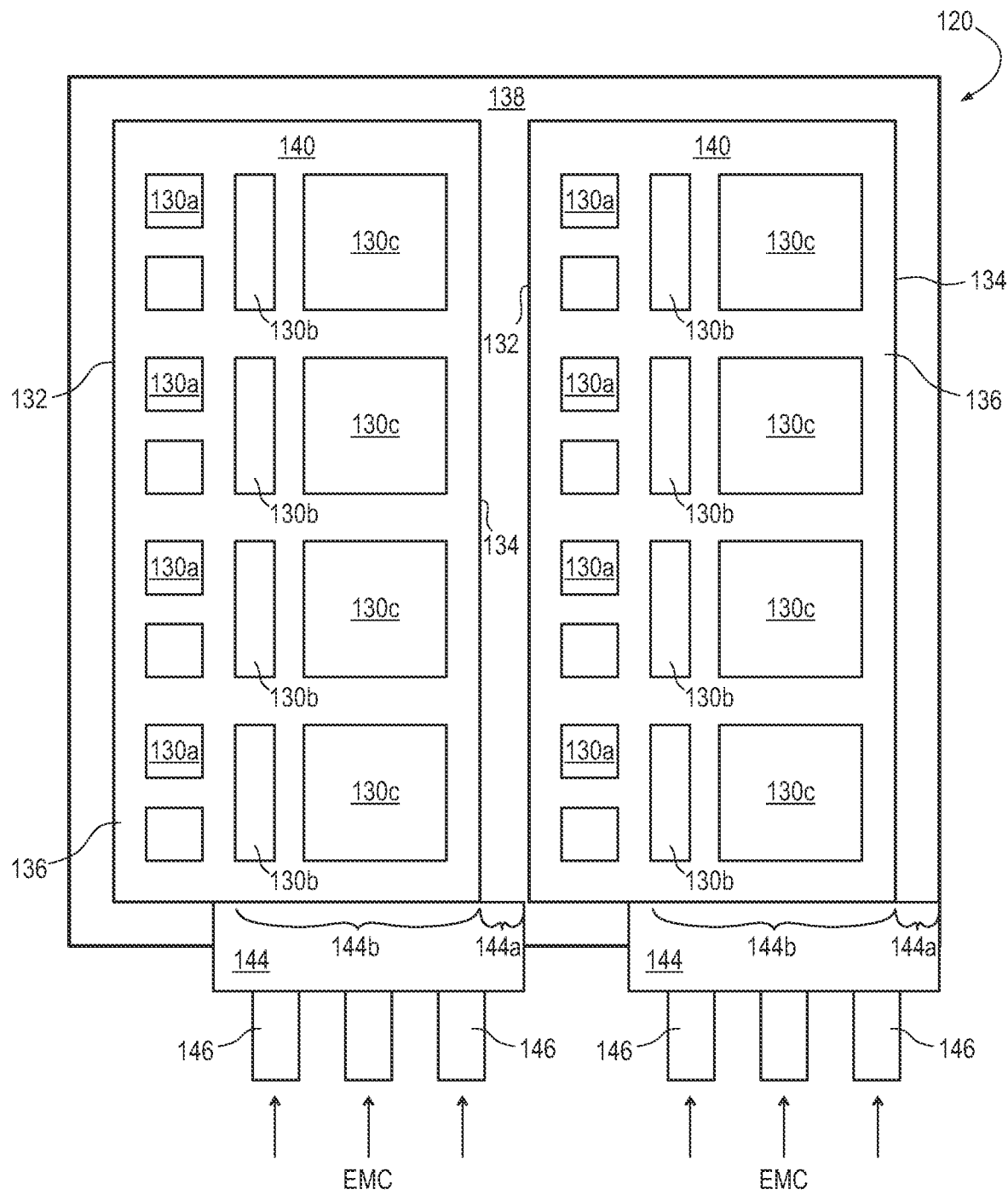

In FIG. 2d, mold gate injectors 144 are disposed at one end of unit strip panels 136. Runners 146 supply encapsulant or EMC 148 evenly across mold gate injector 144. Encapsulant 148 can be polymer composite material, such as epoxy resin with filler, epoxy acrylate with filler, or polymer with proper filler. Encapsulant 148 is non-conductive, provides structural support, and environmentally protects the semiconductor device from external elements and contaminants.

In particular, mold gate injector 144 is shifted off-center of unit strip panel 136 and toward side 134 of the unit strip panel containing the larger electrical components 130c.

Portion 144a of mold gate injector 144 is directed to area 138 outside unit strip panel 136. Portion 144b of mold gate injector 144 is directed to area 140 within unit strip panel 136. As encapsulant 148 flows from mold gate injector 144, the encapsulant has a higher concentration over electrical component 130c. However, the lower flow resistance path over electrical components 130a-130b draws encapsulant 148 back over all electrical components 130a-130c and over unit strip panel 136. The higher flow resistance over electrical component 130c is compensated by shifting the mold gate injector toward side 134. By compensating the encapsulant flow toward the higher flow resistance path over electrical component 130c, encapsulant 148 is drawn back toward the lower flow resistance path over electrical components 130a-130b. The natural encapsulant flow path toward the lower flow resistance over electrical components 130a-130b brings encapsulant 148 back over all electrical components 130a-130c and unit strip panel 136. Electrical components 130a-130c each receive sufficient encapsulant 148 to reduce or prevent voids in the encapsulant.

Figure 2E:
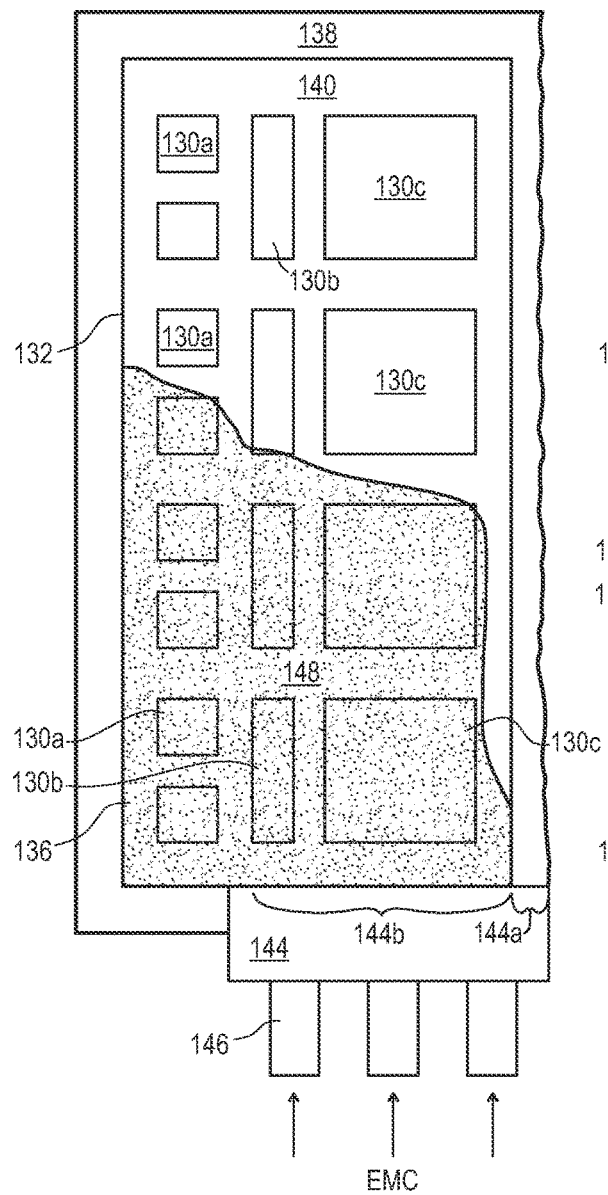
Figure 2F:
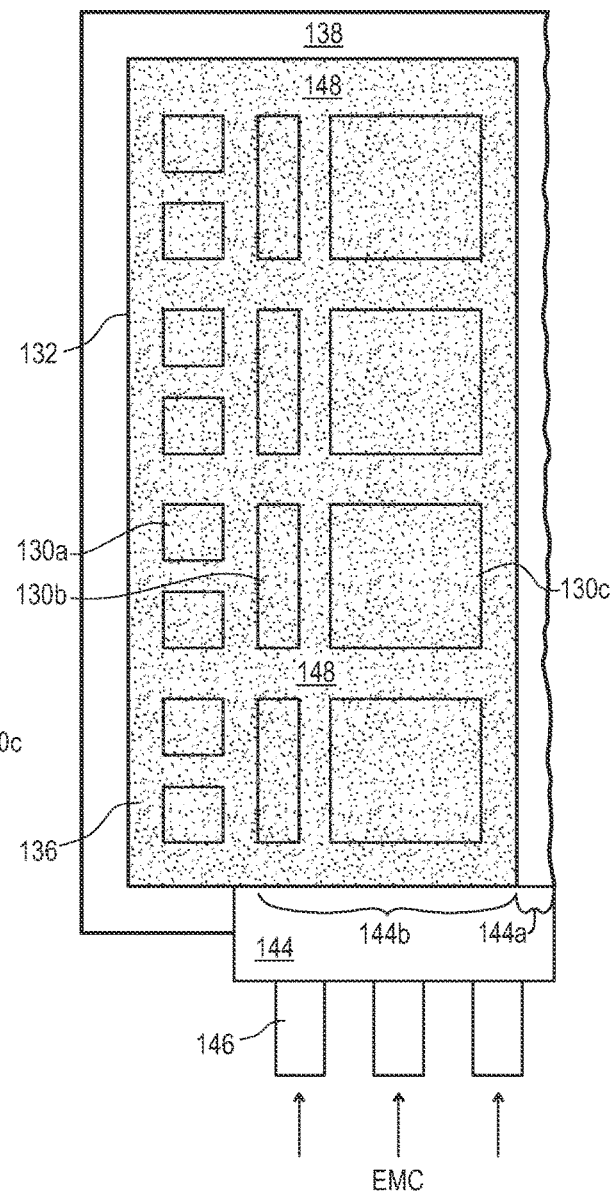

FIG. 2e shows half coverage of encapsulant 148 over electrical components 130a-130c on unit strip panel 136. In FIG. 2f, encapsulant 148 continues to flow toward the lower flow resistance path over electrical components 130a-130b and over unit strip panel 136 to adequately cover all electrical components 130a-130c. FIG. 2f shows full coverage of encapsulant 148 over electrical components 130a-130c on unit strip panel 136.

Figures 3, 4:
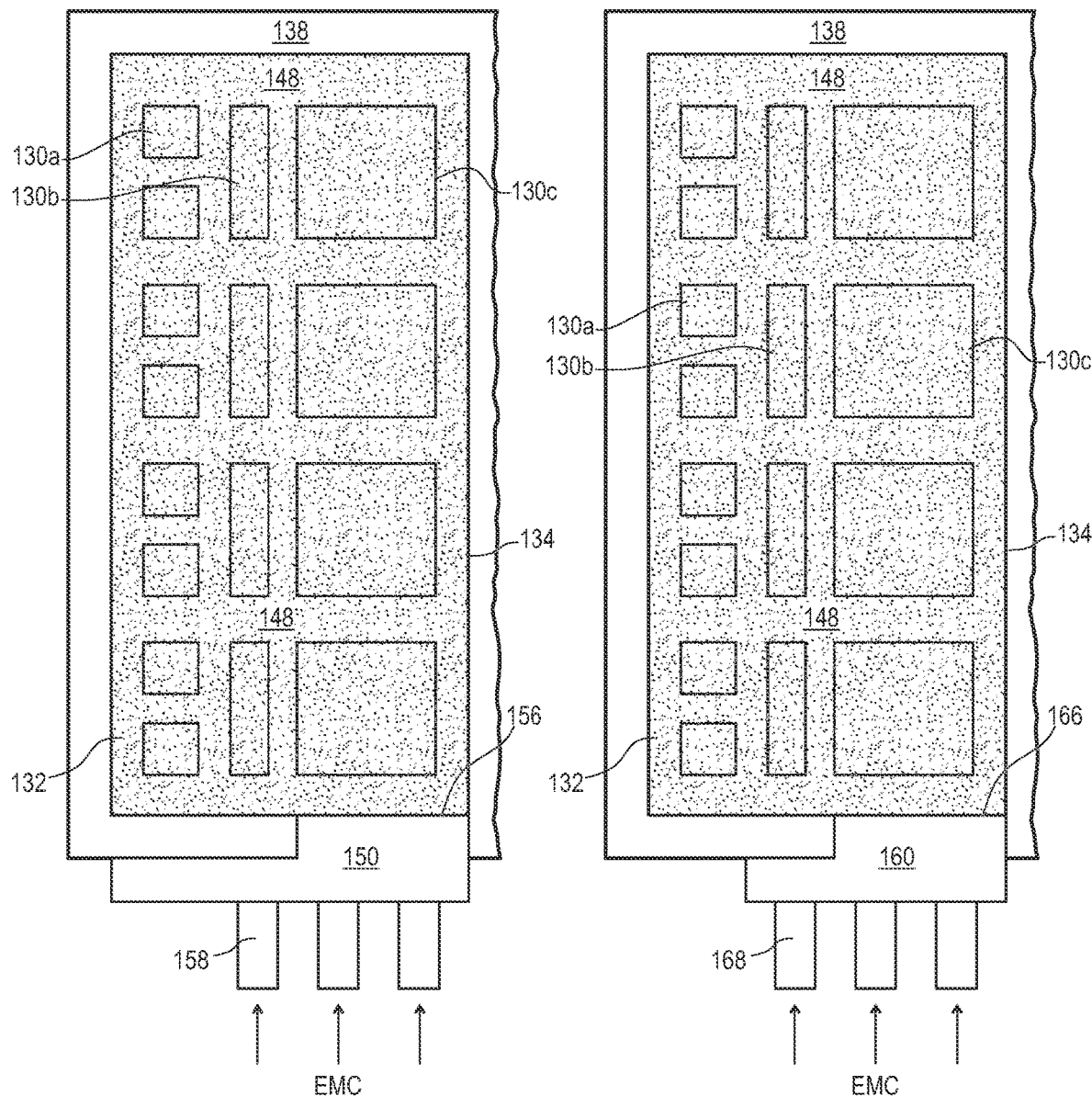
FIG. 3 illustrates a mold gate injector directed over a higher flow resistance path.
FIG. 4 illustrates another embodiment of the mold gate injector directed over a higher flow resistance path.

In another embodiment, FIG. 3 illustrates mold gate injector 150 aligned between side 132 of unit strip panel 136 and side 134 of the unit strip panel. Mold gate injector 150 covers the span between side 132 of unit strip panel 136 and side 134 of the unit strip panel. Discharge port 156 of mold gate injector 150 is located on the right side of unit strip panel 136. Discharge port 156 is smaller than the width of mold gate injector 150 to direct the flow of encapsulant 148 specifically toward the higher flow resistance path over the larger electrical component 130c. The flow of encapsulant 148 through runners 158 is directed from discharge port 156 directly toward the higher flow resistance path over the larger electrical component 130c. The natural flow of encapsulant 148 toward the lower flow resistance over electrical components 130a-130b brings the encapsulant back over electrical components 130a-130b on unit strip panel 136.

In another embodiment, FIG. 4 illustrates mold gate injector 160 shifted toward the right from side 132 of unit strip panel 136. Mold gate injector 160 aligns with side 134 of unit strip panel 136. Discharge port 166 of mold gate injector 160 is located on side 134 of unit strip panel 136. Discharge port 166 is smaller than the width of mold gate injector 160 to direct the flow of encapsulant 148 directly toward the higher flow resistance path over the larger electrical component 130c. The flow of encapsulant 148 through runners 168 is directed from discharge port 166 toward the higher flow resistance path over the larger electrical component 130c. The natural flow of encapsulant 148 toward the lower flow resistance over electrical components 130a-130b brings the encapsulant back over electrical components 130a-130b on unit strip panel 136.

Figures 5, 6:
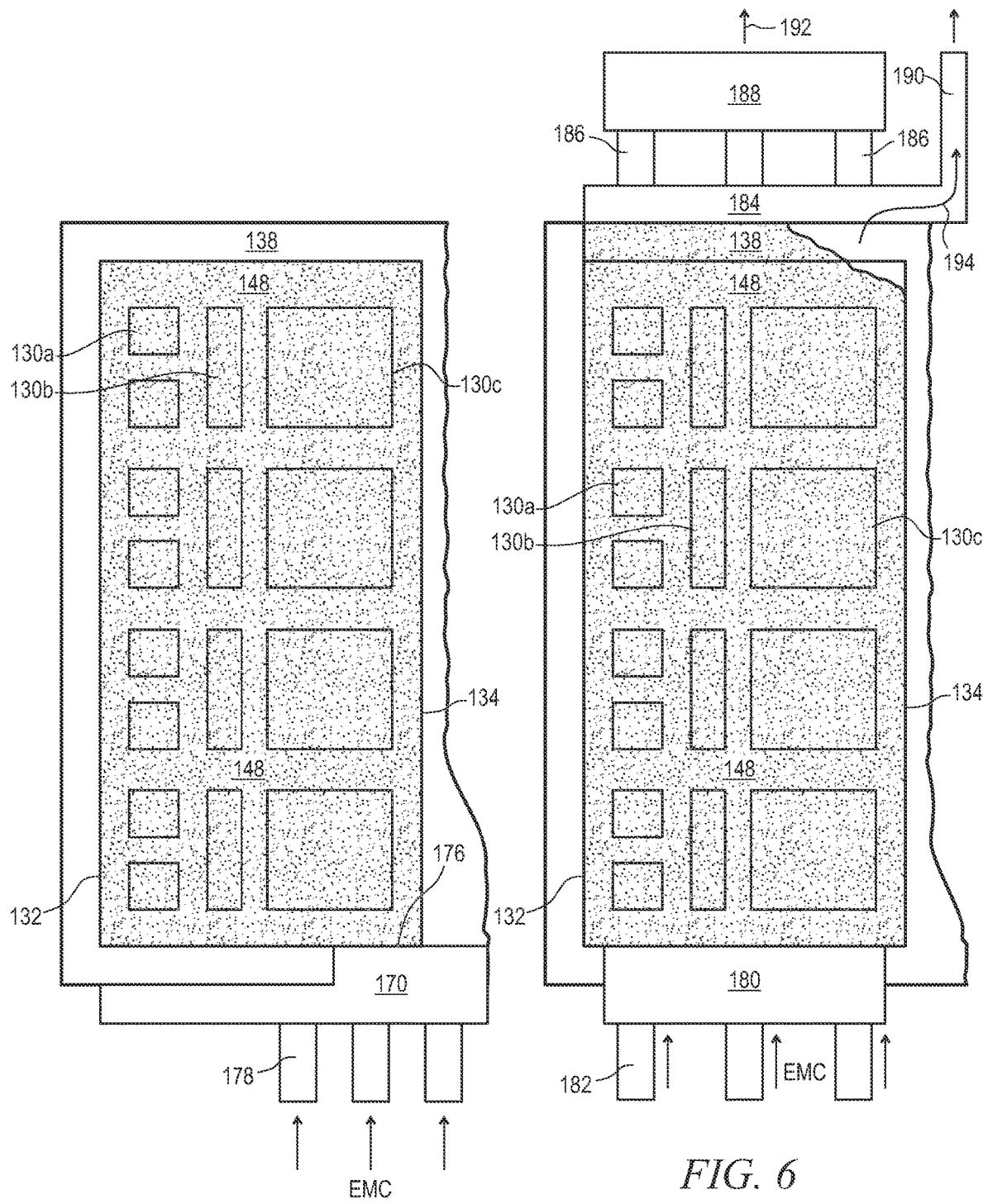
FIG. 5 illustrates another embodiment of the mold gate injector directed over a higher flow resistance path.
FIG. 6 illustrates the mold gate injector with an air vent to purge excess air.

In another embodiment, FIG. 5 illustrates mold gate injector 170 aligned between side 132 of unit strip panel 136 and shifted toward the right from side 134 of the unit strip panel. Discharge port 176 of mold gate injector 170 is directed partially into unoccupied area 138 and partially toward the larger electrical components 130c in area 140 over unit strip panel 136. Discharge port 176 is smaller than the width of mold gate injector 170 to direct the flow of encapsulant 148 directly toward the higher flow resistance path over the larger electrical component 130c. The flow of encapsulant 148 through runners 178 is directed from discharge port 176 toward the higher flow resistance path over the larger electrical component 130c. The natural flow of encapsulant 148 toward the lower flow resistance over electrical components 130a-130b brings the encapsulant back over electrical components 130a-130b on unit strip panel 136.

The common feature for each embodiment in FIGS. 2-5 is that the mold gate injector directs encapsulant 148 along the higher flow resistance over electrical component 130c. The lower flow resistance path over electrical components 130a-130b draws encapsulant 148 back over all electrical components 130a-130c and over unit strip panel 136. By compensating the encapsulant flow toward area 138 and the higher flow resistance path over electrical component 130c, encapsulant 148 is drawn back toward the lower flow resistance path over electrical components 130a-130b. The result is an even and balanced coverage over electrical components 130a-130c on unit strip panel 136.

In another embodiment, FIG. 6 illustrates mold gate injector 180 aligned between side 132 and side 134 of unit strip panel 136. Mold gate injector 180 can assume any one of the embodiments of FIGS. 2-5. Mold gate injector 180 discharges encapsulant 148 from runners 182 over electrical components 130a-130c on unit strip panel 136. At the opposite end of unit strip panel 136, common rail 184 provides an output port to draw encapsulant 138 evenly across the unit strip panel. Runners 186 connect common rail 184 to air tank 188. Air is vented through air tank 188 as shown by arrow 192, which is the main air vent. Air vent 190 is disposed in unoccupied area 138 and connected to common rail 184 to release air trapped over unit strip panel 136. Air vent 190 is an additional air vent to release trapped air as shown by arrow 194. Air vent 190 can be disposed on the opposite side of common rail 184 mold gate injector 180.

Figure 7:
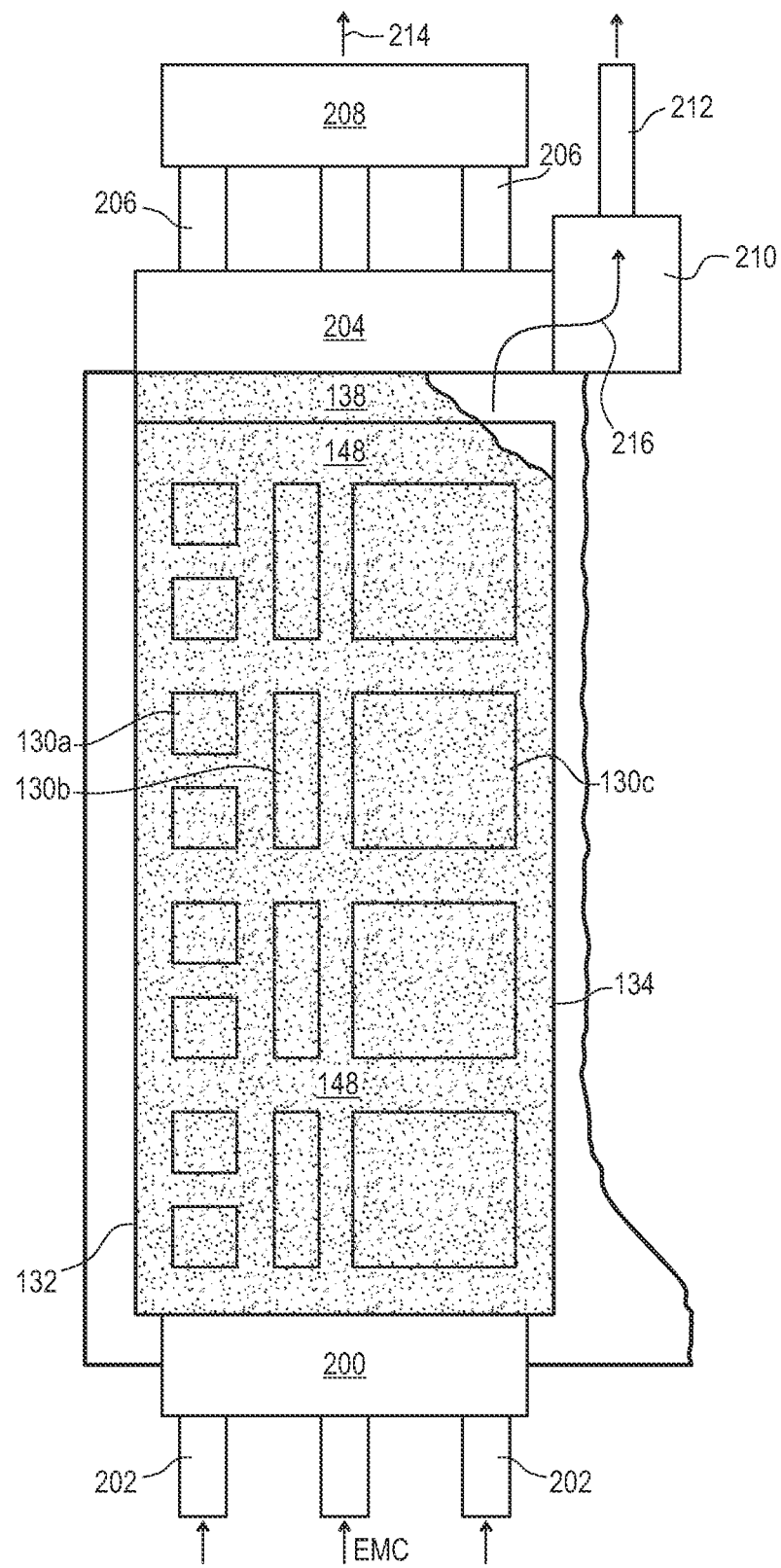
FIG. 7 illustrates another embodiment of the mold gate injector with an air vent to purge excess air.

In another embodiment, FIG. 7 illustrates mold gate injector 200 aligned between side 132 and side 134 of unit strip panel 136. Mold gate injector 200 can assume any one of the embodiments of FIGS. 2-5. Mold gate injector 200 discharges encapsulant 148 from runners 202 over electrical components 130a-130c on unit strip panel 136. At the opposite end of unit strip panel 136, common rail 204 provides an output port to draw encapsulant 138 evenly across the unit strip panel. Runners 206 connect common rail 204 to air tank 208. Air is vented through air tank 208 as shown by arrow 214, which is the main air vent. Air reservoir 210 is disposed in unoccupied area 138 and connected to common rail 204. Air vent 212 is disposed in unoccupied area 138 and connected to air reservoir 210 to release air trapped over unit strip panel 136. Air vent 212 is an additional air vent to release trapped air as shown by arrow 216. Air reservoir 210 and air vent 212 can be disposed on the opposite side of common rail 204.

Figure 8:
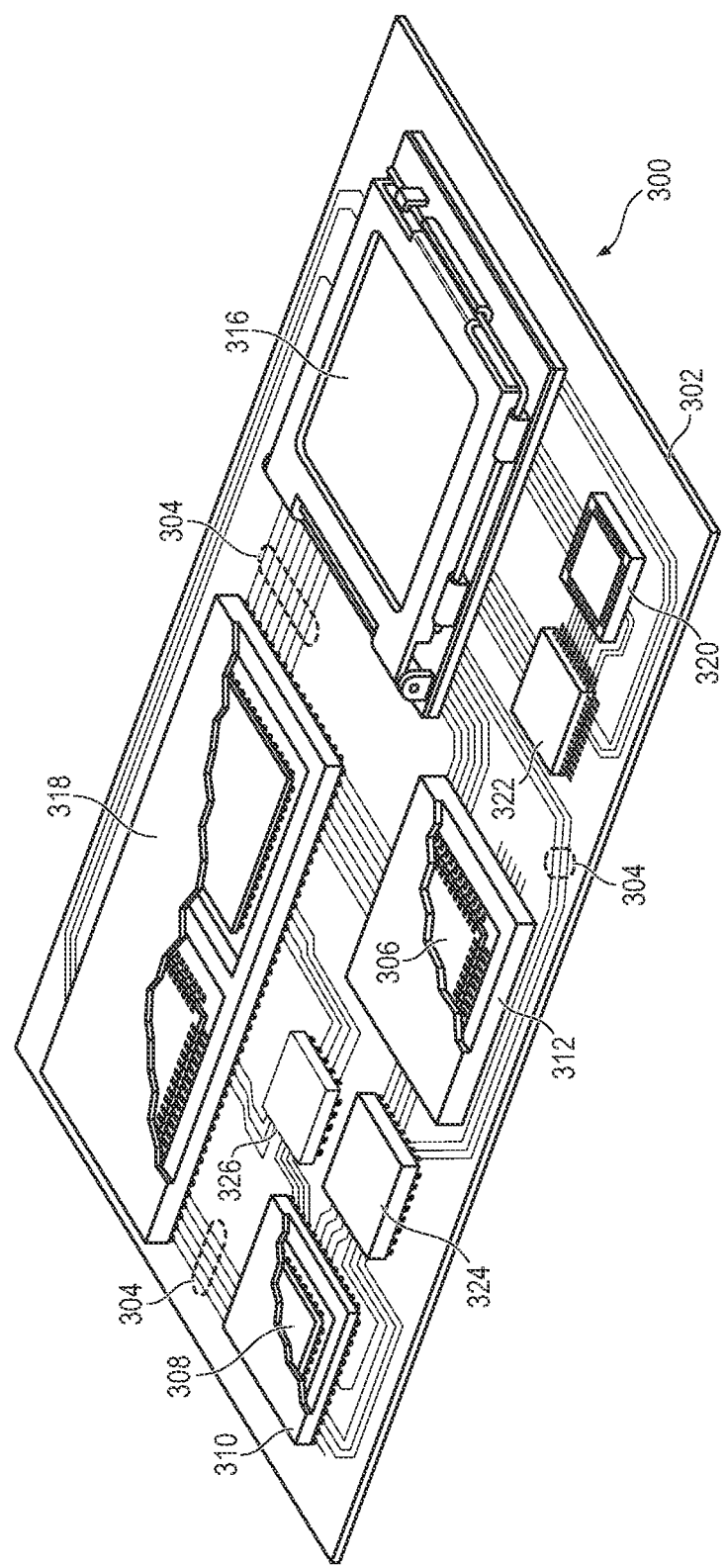
FIG. 8 illustrates a printed circuit board (PCB) with different types of packages mounted to a surface of the PCB.

FIG. 8 illustrates electronic device 300 having a chip carrier substrate or PCB 302 with a plurality of semiconductor packages mounted on a surface of PCB 302, including SIP modules 170, 210, and 236. Electronic device 300 can have one type of semiconductor package, or multiple types of semiconductor packages, depending on the application.

Electronic device 300 can be a stand-alone system that uses the semiconductor packages to perform one or more electrical functions. Alternatively, electronic device 300 can be a subcomponent of a larger system. For example, electronic device 300 can be part of a tablet, cellular phone, digital camera, communication system, or other electronic device. Alternatively, electronic device 300 can be a graphics card, network interface card, or other signal processing card that can be inserted into a computer. The semiconductor package can include microprocessors, memories, ASIC, logic circuits, analog circuits, RF circuits, discrete devices, or other semiconductor die or electrical components. Miniaturization and weight reduction are essential for the products to be accepted by the market. The distance between semiconductor devices may be decreased to achieve higher density.

In FIG. 8, PCB 302 provides a general substrate for structural support and electrical interconnect of the semiconductor packages mounted on the PCB. Conductive signal traces 304 are formed over a surface or within layers of PCB 302 using evaporation, electrolytic plating, electroless plating, screen printing, or other suitable metal deposition process. Signal traces 304 provide for electrical communication between each of the semiconductor packages, mounted components, and other external system components. Traces 304 also provide power and ground connections to each of the semiconductor packages.

In some embodiments, a semiconductor device has two packaging levels. First level packaging is a technique for mechanically and electrically attaching the semiconductor die to an intermediate substrate. Second level packaging involves mechanically and electrically attaching the intermediate substrate to the PCB. In other embodiments, a semiconductor device may only have the first level packaging where the die is mechanically and electrically mounted directly to the PCB. For the purpose of illustration, several types of first level packaging, including bond wire package 306 and flipchip 308, are shown on PCB 302. Additionally, several types of second level packaging, including ball grid array (BGA) 310, bump chip carrier (BCC) 312, land grid array (LGA) 316, multi-chip module (MCM) or SIP module 318, quad flat non-leaded package (QFN) 320, quad flat package 322, embedded wafer level ball grid array (eWLB) 324, and wafer level chip scale package (WLCSP) 326 are shown mounted on PCB 302. In one embodiment, eWLB 324 is a fan-out wafer level package (Fo-WLP) and WLCSP 326 is a fan-in wafer level package (Fi-WLP). Depending upon the system requirements, any combination of semiconductor packages, configured with any combination of first and second level packaging styles, as well as other electronic components, can be connected to PCB 302. In some embodiments, electronic device 300 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
    providing a strip panel;
    disposing a plurality of electrical components over the strip panel, wherein the plurality of electrical components includes a first electrical component having a first profile and a second electrical component having a second profile and the first profile is greater than the second profile; and
    disposing an encapsulant over the electrical components by directing a higher concentration of the encapsulant in a path toward the first electric component with a first flow resistance for the encapsulant over the first electrical component being greater by nature of the first profile being greater than the second profile, and directing less of the encapsulant in a path toward the second electrical component with a second flow resistance for the encapsulant over the second electrical component by nature of the second profile.

2. The method of claim 1, further including providing a mold gate injector to dispose the encapsulant over the electrical components.

3. The method of claim 2, wherein the mold gate injector is shifted toward a side of the strip panel with the path toward the first flow resistance for the encapsulant.

4. The method of claim 2, wherein the mold gate injector includes a discharge port smaller than a width of the mold gate injector and directed toward the path toward the first flow resistance for the encapsulant.

5. The method of claim 4, wherein the discharge port is shifted toward a side of the strip panel with the path toward the first flow resistance for the encapsulant.

6. The method of claim 2, further including providing an air vent coupled to the mold gate injector to release excess air from the encapsulant.

7. A method of making a semiconductor device, comprising:
    providing a plurality of electrical components, wherein larger ones of the plurality of electrical components have a first profile and smaller ones of the plurality of electrical components have a second profile and the first profile is greater than the second profile; and
    disposing an encapsulant over the electrical components by directing a higher concentration of the encapsulant in a path toward the larger ones of the electrical components with the first profile than the smaller ones of the electrical components with the second profile.

8. The method of claim 7, further including providing a mold gate injector to dispose the encapsulant over the electrical components.

9. The method of claim 8, wherein the mold gate injector is shifted toward the larger ones of the electrical components.

10. The method of claim 8, wherein the mold gate injector includes a discharge port smaller than a width of the mold gate injector and directed toward the larger ones of the electrical components.

11. The method of claim 10, wherein the discharge port is shifted toward the larger ones of the electrical components.

12. The method of claim 8, further including providing an air vent coupled to the mold gate injector to release excess air from the encapsulant.

13. The method of claim 8, further including providing an air tank coupled to the mold gate injector to release excess air from the encapsulant.

14. The method of claim 7, further including directing less of the encapsulant in a path toward the smaller ones of the electrical components with the second profile.

15. A semiconductor manufacturing device, comprising:
    a strip panel;

a plurality of electrical components disposed over the strip panel, wherein the plurality of electrical components includes a first electrical component having a first profile and a second electrical component having a second profile and the first profile is greater than the second profile; and an encapsulant disposed over the electrical components with a higher concentration of the encapsulant directed in a path toward the first electrical component with the first profile and having a greater flow resistance for the encapsulant than in a path toward the second electrical component with the second profile and having a lesser flow resistance for the encapsulant.

16. The semiconductor manufacturing device of claim 15, further including a mold gate injector to dispose the encapsulant over the electrical components.

17. The semiconductor manufacturing device of claim 16, wherein the mold gate injector is shifted toward a side of the strip panel with the path toward the first electrical component having the greater flow resistance for the encapsulant.

18. The semiconductor manufacturing device of claim 16, wherein the mold gate injector includes a discharge port smaller than a width of the mold gate injector and directed toward the first electrical component having the greater flow resistance for the encapsulant.

19. The semiconductor manufacturing device of claim 18, wherein the discharge port is shifted toward a side of the strip panel with the path toward the first electrical component having the greater flow resistance for the encapsulant.

20. The semiconductor manufacturing device of claim 16, further including an air vent coupled to the mold gate injector to release excess air from the encapsulant.

21. A semiconductor manufacturing device, comprising:

a plurality of electrical components; and an encapsulant disposed over the electrical components with a higher concentration of the encapsulant directed in a path toward a first electrical component with a first profile and having a greater flow resistance for the encapsulant than in a path toward a second electrical component with a second profile and having a lesser flow resistance for the encapsulant.

22. The semiconductor manufacturing device of claim 21, further including a mold gate injector to dispose the encapsulant over the electrical components.

23. The semiconductor manufacturing device of claim 22, wherein the mold gate injector is shifted toward the path of the first electrical component having the greater flow resistance for the encapsulant.

24. The semiconductor manufacturing device of claim 22, wherein the mold gate injector includes a discharge port smaller than a width of the mold gate injector and directed toward the first electrical component having the greater flow resistance for the encapsulant.

25. The semiconductor manufacturing device of claim 24, wherein the discharge port is shifted toward the first electrical component having the greater flow resistance for the encapsulant.

26. The semiconductor manufacturing device of claim 25, further including an air vent coupled to the mold gate injector to release excess air from the encapsulant.

* * * * *